United States Patent [19]
Fukunaga et al.

[11] Patent Number: 6,018,884
[45] Date of Patent: Feb. 1, 2000

[54] AIR BLOW APPARATUS FOR A SEMICONDUCTOR WAFER

[75] Inventors: Hisaya Fukunaga; Katsutoshi Kurogi, both of Kanagawa, Japan

[73] Assignee: Komatsu Electronic Metals Co., Ltd., Kanagawa, Japan

[21] Appl. No.: 08/884,852

[22] Filed: Jun. 30, 1997

[30] Foreign Application Priority Data

Jun. 29, 1996 [JP] Japan .................................. 8-204066

[51] Int. Cl.[7] ...................................................... F26B 25/00
[52] U.S. Cl. ............................................. 34/107; 432/239
[58] Field of Search ............................. 34/107; 432/239; 134/102.3

[56] References Cited

U.S. PATENT DOCUMENTS 4,941,490  7/1990  Gross .................................. 134/102.3

*Primary Examiner*—Henry Bennett
*Assistant Examiner*—Malik N. Drake
*Attorney, Agent, or Firm*—Sughrue, Mion, Zinn, Macpeak & Seas, PLLC

[57] ABSTRACT

An air blow apparatus peels wafers off and simultaneously removes grease and grindstone grains by blowing air into gaps formed between semiconductor wafers sliced by a wire saw from a semiconductor ingot. Two injection nozzles 1a, 1b are symmetrically mounted at predetermined positions with respect to the central line c of the semiconductor wafer 10. Air injections 11a, 11b are injected from the outer top of the semiconductor wafer 10. Injection nozzles 1a, 1b are arranged so that they are movable in the longitudinal direction of the semiconductor ingot. Air injections 11a, 11b are set to be blown out at a cone shape of about 30 degrees.

11 Claims, 3 Drawing Sheets

AIR BLOW APPARATUS FOR A SEMICONDUCTOR WAFER

BACKGROUND OF THE INVENTION

1. Field of the Invention

The present invention relates to an air blow apparatus for removing the grease or grindstone grains enter the gaps between semiconductor wafers sliced by a wire saw.

2. Description of the related Art

Recently, the throughput of the slicing step of semiconductor ingots has been significantly increased due to the use of wire saws for the slicing operation. The semiconductor ingot sliced by the wire saw is transported to the washing step in a row with its peripheral portion being bonded to the slicing table. Moreover, when slicing by a wire saw, grindstone grains and greases are used, and thus a large amount of slurry-like grindstone grains and greases adhere to the sliced semiconductor wafers. In particular, the slurry-like grindstone grains and greases enter the gaps formed between the semiconductor wafers, and by surface tension of the greases, the semiconductor wafers are bonded together.

Accordingly, it is difficult to remove by washing alone the grindstone grains and greases enter the gaps formed between the fixed semiconductor wafers.

SUMMARY OF THE INVENTION

In view of the above problem, an object of the invention is to provide an air blow apparatus which can peel bonded wafers off and simultaneously remove greases and grindstone grains by blowing air into the gaps formed between semiconductor wafers sliced by a wire saw.

In order to attain the above object, the invention provides an air blow apparatus which blows air into the gaps formed between semiconductor wafers sliced from a semiconductor ingot by a wire saw from a peripheral direction, wherein an injection nozzle, which is so designed that the air blows with a directivity less than a predetermined angle, is provided and the injection nozzle is movable in the longitudinal direction of the semiconductor ingot.

Moreover, the invention provides an air blow apparatus which blows air into the gaps formed between semiconductor wafers sliced from a semiconductor ingot by a wiresaw from a peripheral direction, wherein at least a pair of injection nozzles, which are so designed that the air blows with a directivity less than a predetermined angle, are provided, the injection nozzles are mounted at opposite positions to the two sides at which the injection nozzles are clamped over the semiconductor wafers, and the injection nozzles are movable in the longitudinal direction of the semiconductor ingot while being maintained in opposite positions.

In order to provide a blow apparatus which can uniformly blow air to all the semiconductor wafers in a fixing state on a slicing table so as to peel off the semiconductor wafer and simultaneously remove the grease and grindstone grains, injection nozzles having directivity are symmetrically mounted at the both sides with respect to the semiconductor wafers and are movable in the axial direction of the semiconductor ingot.

BRIEF DESCRIPTION OF THE DRAWINGS

The blow apparatus of the invention is hereinafter described with reference to the preferred embodiments and accompanying drawings in which.

DESCRIPTION OF THE PREFERRED EMBODIMENTS

Embodiment 1

Figure 1:
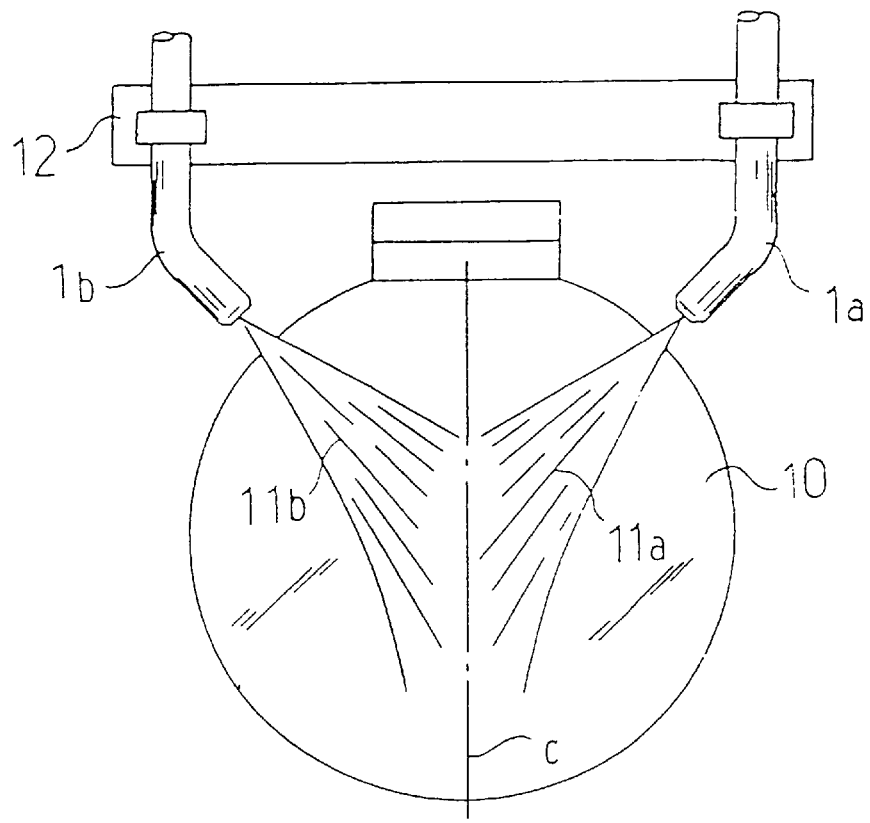
FIG. 1 is a schematic view of the air blow apparatus of embodiment 1 of the present invention.

Referring to FIG. 1, the air blow apparatus of embodiment 1 of the present invention is provided with two injection nozzles 1a, 1b symmetrically mounted at the positions with respect to the central line c of the semiconductor wafer 10, and air injections 11a, 11b are injected from the outer top of the semiconductor wafer 10. Moreover, the injection nozzles 1a, 1b are fixed on the nozzle-fixing table 12 and the injection angles thereof are adjustable.

Figure 2:
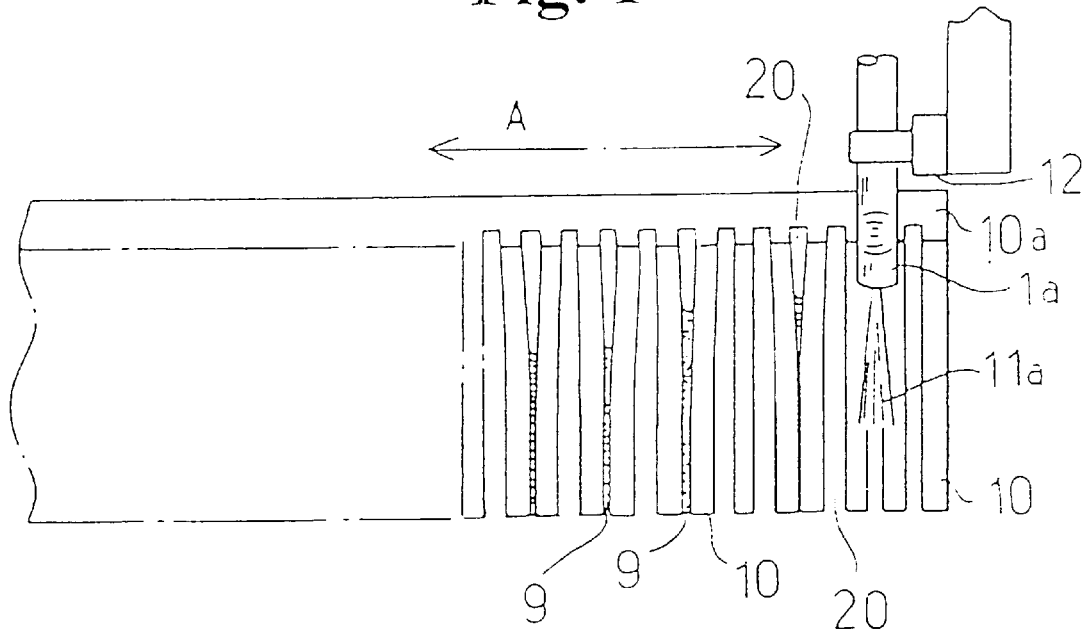
FIG. 2 is a side view of the air blow apparatus of embodiment 1 of the present invention.

Referring to FIG. 2, the peripheral portion of the semiconductor wafers 10 sliced by a wire saw is fixed to the slicing table 10a in a row, and slurry-like adhered agent 9 including greases and grindstone grains come into the gaps formed between the semiconductor wafers 10.

Figure 3:
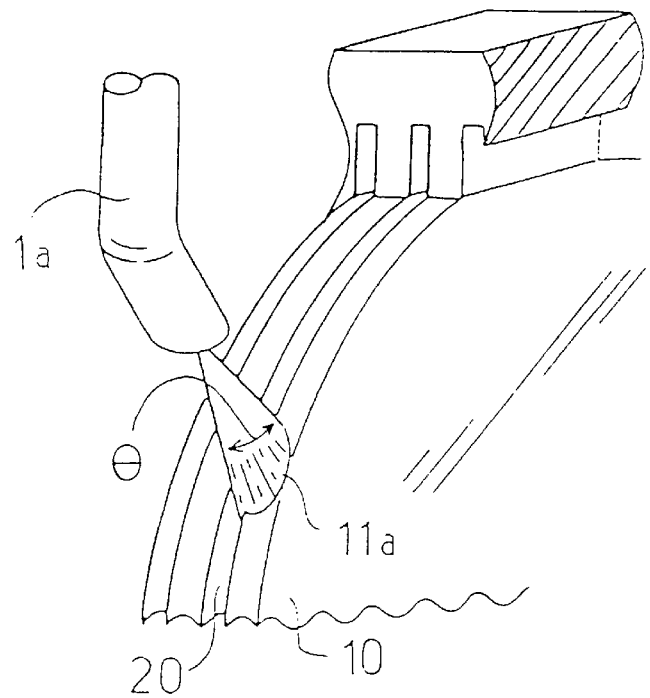
FIG. 3 is a partial perspective view showing the injection of air from the injection nozzle in accordance with embodiment 1 of the present invention.

The nozzle-fixing table 12 is designed to be movable in the longitudinal direction (arrow A) of the semiconductor ingot before slicing along the slice table 10a. And in this way, as shown in FIG. 1, the injection nozzles 1a, 1b are moved in horizontal direction while being maintained in their symmetrical state, and thus air injections 11a, 11b are able to be reliably blown into all the gaps 20 formed between the semiconductor wafers 10. Referring to FIG. 3, the air injections 11a from the injection nozzle 1a are cone-shaped-and the blowing out angle θ is set to about 30 degrees to have directivity, and thus the air can be reliably blown into the gaps 20 formed between the semiconductor wafers 10. Also, the injection nozzle 1b is of the same type of the injection nozzle 1a.

Moreover, the nozzle-fixing table 12 is mounted on the lifter (not shown) of the washing apparatus for holding and moving the semiconductor wafers 10, and thus in the washing step of the semiconductor wafer 10, air can be blown at each washing. Accordingly, the adhered agent 9 is efficiently and reliably removed.

Embodiment 2

Figure 4:
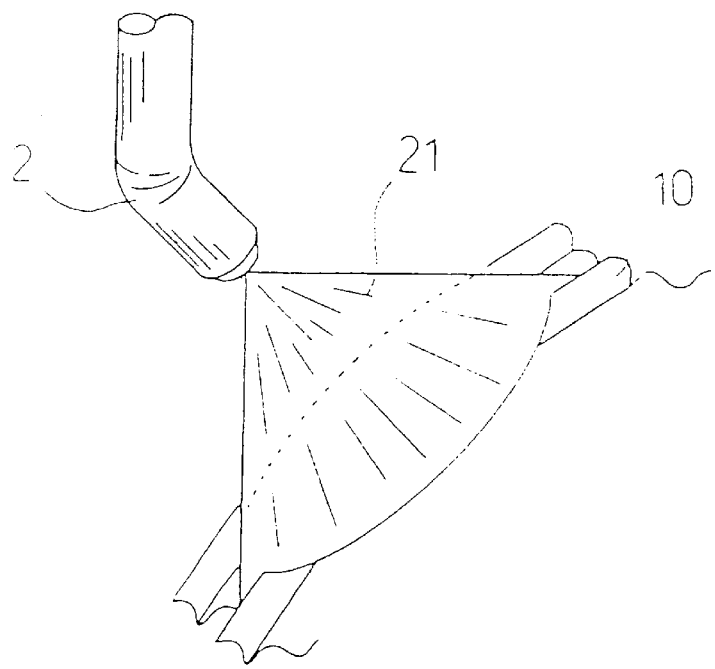
FIG. 4 is a partial perspective view showing the injection of the air from the injection nozzle in accordance with embodiment 2 of the present invention.

Referring to FIG. 4, the air injection 21 from the injection nozzle 2 of the embodiment 2 spreads in a sectoral shape along the sectional surface of the semiconductor wafers 10 and blows out in a flat shape. Accordingly, air can be blown into the entire gaps between the semiconductor wafers 10.

Embodiment 3

Figure 5:
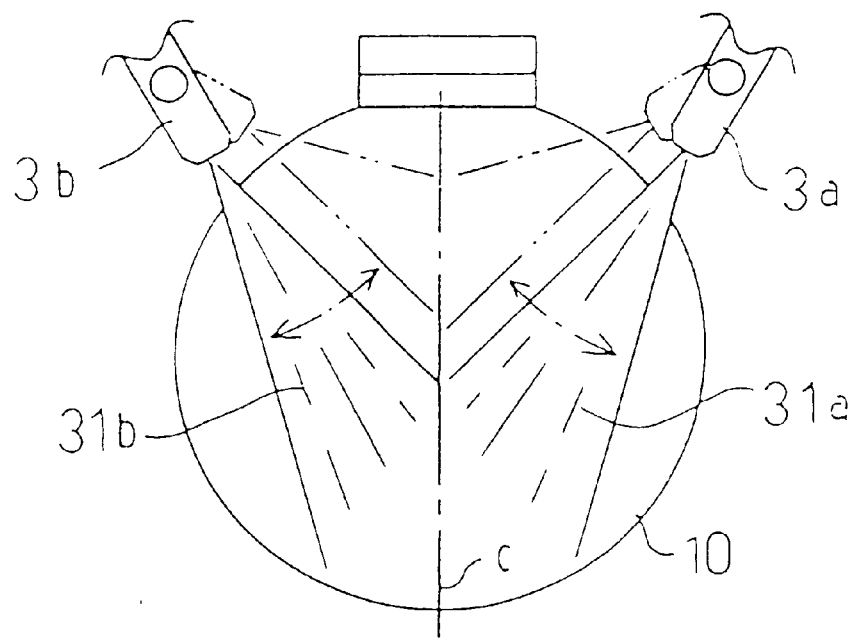
FIG. 5 is a schematic view showing the air blow apparatus of embodiment 3 of the present invention.

Referring to FIG. 5, the injection nozzles 3a, 3b of the air blow apparatus of embodiment 3 are so arranged that they are symmetrically mounted at the positions with respect to the central line c of the semiconductor wafer 10, as in the embodiment 1, however, the injection angle of each is changeable. Accordingly, air injections 31a, 31b are injected into the entire sectional surface of the semiconductor wafer 10, and thus the adhered agent can be removed more efficiently.

Embodiment 4

Figure 6:
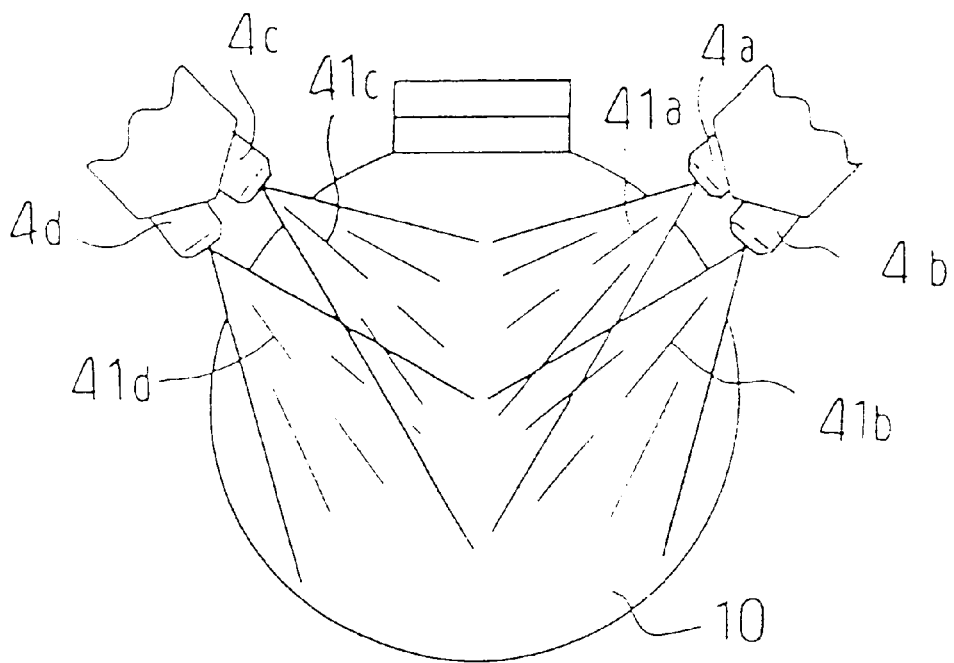
FIG. 6 is a schematic view showing the air blow apparatus of embodiment 4 of the present invention.

Referring to FIG. 6, the air blow apparatus of the embodiment 4 is provided with two pairs of injection nozzles 4a, 4b, 4c and 4d. The injection nozzles 4a, 4b and 4c, 4d, are respectively positioned at the same side with respect to the semiconductor wafer 10. The injection nozzles 4a and 4b are set to have different injection directions to each other, and the injection nozzles 4c and 4d are also set to have different injection directions to each other. And thus by injecting air injections 41a, 41b, 41c and 41d over the entire sectional surface of the semiconductor wafer 10, the adhered agent can be removed efficiently.

The invention is constructed as above, and thus by blowing air into the gaps formed between semiconductor wafers sliced by a wire saw, the semiconductor wafers are peeled off and the greases and grindstone grains can be removed. Accordingly, in the washing step, even the gaps between semiconductor wafers can be reliably washed and an excellent effect is obtained.

What is claimed is:

1. An air blow apparatus for blowing air into formed between semiconductor wafers, from a peripheral direction thereof, the semiconductor wafers being sliced from a semiconductor ingot by a wire saw, said apparatus comprising:

at least a pair of injection nozzles, which blows the air with a directivity less than a predetermined angle, the nozzles being mounted at opposite positions to both sides of the semiconductor wafers, said injection nozzles being clamped over the semiconductor wafers, wherein said injection nozzles are movable in a longitudinal direction of the semiconductor ingot while being maintained in opposite positions.

2. The air blow apparatus as claimed in claim 1, wherein at least one pair of the injection nozzles are so arranged that blowing directions thereof are symmetrical with respect to a central line of each of the semiconductor wafers.

3. The air blow apparatus as claimed in or claim 1, wherein the air blown out from said injection nozzles is cone-shaped and the predetermined angle is less than 30 degrees.

4. The air blow apparatus as claimed in or claim 1, wherein the air blown out from said injection nozzles spreads in a sectoral shape along a sectional surface of the semiconductor wafers.

5. The air blow apparatus as claimed in claim 1, wherein the air is blown out from said injection nozzles in an adjustable direction along a sectional surface of one of the semiconductor wafer.

6. The air blow apparatus as claimed in claim 1, further comprising a plurality of injection nozzles respectively mounted on at least one side of the semiconductor wafers and each of the plurality of injection nozzles is set so as to blow the air to a different part of one of the semiconductor wafers.

7. The air blow apparatus as claimed in claim 1, wherein a injection nozzles are provided on the lifter for holding and moving the semiconductor wafers.

8. An air blow apparatus for blowing air into gaps formed between semiconductor wafers, from a peripheral direction thereof, the semiconductors wafers being sliced from a semiconductor ingot by a wire saw, said apparatus comprising:

an injection nozzle, which blows air with a directivity less than a predetermined angle, wherein the injection nozzle is moveable in a longitudinal direction of the semiconductor ingot;

wherein the air blown out from said injection nozzle is cone-shape and the predetermined angle is less than 30 degrees.

9. An air blow apparatus for blowing air into gaps formed between semiconductor wafers, from a peripheral direction thereof, the semiconductors wafers being sliced from a semiconductor ingot by a wire saw, said apparatus comprising:

an injection nozzle, which blows air with a directivity less than a predetermined angle, wherein the injection nozzle is moveable in a longitudinal direction of the semiconductor ingot;

wherein the air blown out from said injection nozzle spreads in a sectoral shape along a sectional surface of the semiconductor wafers.

10. An air blow apparatus for blowing air into gaps formed between semiconductor wafers, from a peripheral direction thereof, the semiconductors wafers being sliced from a semiconductor ingot by a wire saw, said apparatus comprising:

an injection nozzle, which blows air with a directivity less than a predetermined angle, wherein the injection nozzle is moveable in a longitudinal direction of the semiconductor ingot;

wherein the air is blown out from said injection nozzle in an adjustable direction along a sectional surface of one of the semiconductors wafers.

11. An air blow apparatus for blowing air into gaps formed between semiconductor wafers, from a peripheral direction thereof, the semiconductors wafers being sliced from a semiconductor ingot by a wire saw, said apparatus comprising:

an injection nozzle, which blows air with a directivity less than a predetermined angle, wherein the injection nozzle is moveable in a longitudinal direction of the semiconductor ingot;

wherein the injection nozzle is provided on a lifter for holding and moving the semiconductor wafers.

* * * * *